US 8,136,019 B2

(12) United States Patent
Allen et al.

(10) Patent No.: US 8,136,019 B2
(45) Date of Patent: Mar. 13, 2012

(54) TRANSPARENT ENVELOPE FOR XML MESSAGES

(75) Inventors: Nicholas Alexander Allen, Redmond, WA (US); Erik Bo Christensen, Shoreline, WA (US); Stephen Maine, Seattle, WA (US); Stephen James Millet, Edmonds, WA (US); Kenneth David Wolf, Seattle, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

(21) Appl. No.: 13/034,350

(22) Filed: Feb. 24, 2011

(65) Prior Publication Data

US 2011/0145684 A1    Jun. 16, 2011

Related U.S. Application Data

(62) Division of application No. 11/752,472, filed on May 23, 2007, now Pat. No. 7,925,783.

(51) Int. Cl.
   *H03M 13/00* (2006.01)
(52) U.S. Cl. .................... 714/776; 709/239
(58) Field of Classification Search .......... 714/776; 709/239
   See application file for complete search history.

(56) References Cited

U.S. PATENT DOCUMENTS

| | | | |
|---|---|---|---|
| 5,896,383 A | 4/1999 | Wakeland | |
| 5,991,806 A | 11/1999 | McHann, Jr. | |
| 6,370,590 B1 | 4/2002 | Nitz et al. | |
| 6,556,617 B1 | 4/2003 | Tsujimoto | |
| 6,668,284 B1 | 12/2003 | Parkhurst | |
| 6,742,181 B1 | 5/2004 | Koike et al. | |
| 6,880,016 B1 | 4/2005 | Van Der Heijden et al. | |
| 7,016,831 B2 | 3/2006 | Suzuki et al. | |
| 7,142,610 B1 | 11/2006 | Wang | |
| 7,164,727 B2 | 1/2007 | Wengerter et al. | |
| 7,167,924 B1 | 1/2007 | Symonds et al. | |
| 7,680,670 B2 | 3/2010 | Lamblin et al. | |

(Continued)

FOREIGN PATENT DOCUMENTS

EP          1151583          11/2001

OTHER PUBLICATIONS

Brooks, Dick, et al, , ebXML Transport, Routing & Packaging Message Envelope Specification, http://www.ebxml.org/speedrafts/Envv0-5.pdf, working draft May 26, 2000, 23 pages, v0-5.doc, Oasis, USA.

(Continued)

*Primary Examiner* — M. Mujtaba K Chaudry
(74) *Attorney, Agent, or Firm* — Senniger Powers LLP

(57) ABSTRACT

Transforming portions of a message to a destination via a communication protocol. A message is received. It is detected whether the received message includes an encoded envelope. The encoded envelope includes a stack defining parameters including information for handling the received message in an original format. If the received message includes the encoded envelope, the defined parameters are transformed to coded parameters in a common format. The coded parameters express the same information for handling the received message in the communication protocol. The encoded envelope is encapsulated in the received message, and the received message in the common format is delivered to the destination. If the received message does not include an encoded envelope, coded parameters are generated in the common format for the received message by encoding addressing information from the received message. The received message having the coded parameters in the common format is delivered to the destination.

20 Claims, 5 Drawing Sheets

U.S. PATENT DOCUMENTS

| | | |
|---|---|---|
| 7,746,927 B1 | 6/2010 | Hamilton et al. |
| 2002/0161907 A1* | 10/2002 | Moon .......................... 709/230 |
| 2004/0210500 A1* | 10/2004 | Sobel et al. .................... 705/35 |
| 2005/0021836 A1 | 1/2005 | Reed et al. |
| 2005/0091051 A1 | 4/2005 | Moriya et al. |
| 2005/0198160 A1* | 9/2005 | Shannon et al. .............. 709/206 |
| 2006/0036435 A1 | 2/2006 | Kovesi et al. |
| 2006/0064667 A1 | 3/2006 | Freitas |
| 2006/0106941 A1 | 5/2006 | Singhal |
| 2006/0235983 A1 | 10/2006 | Layman |
| 2007/0201655 A1 | 8/2007 | Shenfield |

OTHER PUBLICATIONS

Bau, David, XML Beans, Dev2Dev, http://dev2dev.bea.com/pub/a/2003/03/Bau.html, Mar. 3, 2003, 11 pages, Bea Systems, USA.

* cited by examiner

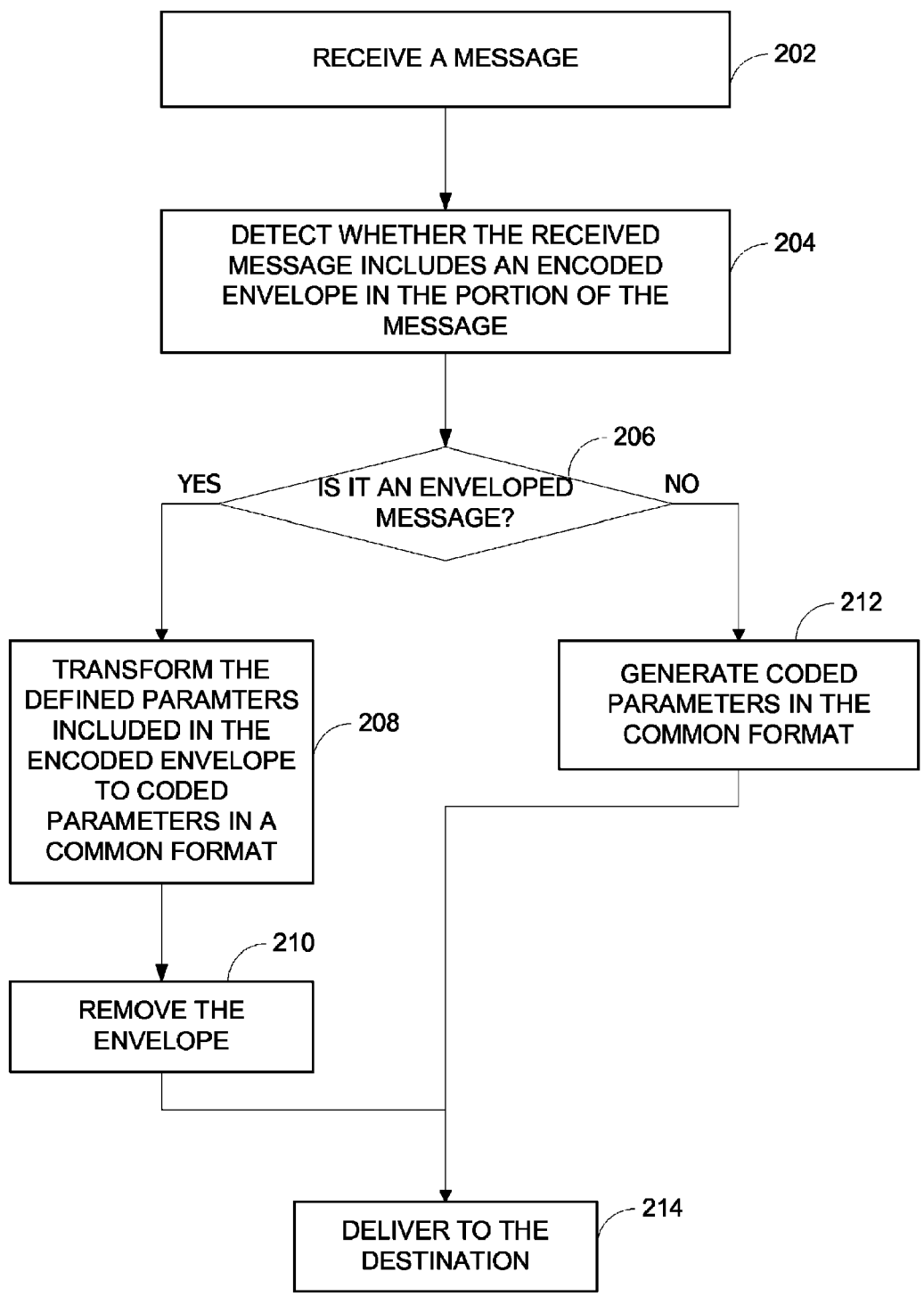

TRANSPARENT ENVELOPE FOR XML MESSAGES

CROSS-REFERENCE TO RELATED APPLICATION(S)

This application is a divisional of U.S. Ser. No. 11/752,472, filed May 23, 2007, the entire contents of which are incorporated herein by reference.

BACKGROUND

Extensible Markup Language (XML) messages can be sent in two different forms: an enveloped message or a message without an envelope. For example, enveloped messages encapsulate an application-structured XML payload with message metadata (headers) and addressing information. Common envelope models, such as the Simple Object Access Protocol (SOAP) envelope, assume that the initial sender and ultimate receiver both support an envelope format. On the other hand, a non-enveloped message does not include such structured information and metadata within the payload. Instead, the non-enveloped message relies on out-of-band data for addressing information and maybe header information.

Based on these implementations of enveloped and non-enveloped messages, message platforms or processing applications must provide separate processing algorithms or codes for processing the enveloped and non-enveloped messages. For example, platforms or applications that receive an enveloped message need to be able to understand and process the enveloped information and format before the message can be processed. Similarly, the platforms or applications would process a non-enveloped message using a separate code base. As a result, current practices incur additional development costs and resource requirements in developing the algorithm to process either the enveloped or non-enveloped messages.

SUMMARY

Embodiments of the invention solve the problem of existing practices by creating a common format for converting an enveloped or a non-enveloped message to a canonical message. Aspects of the invention remove the need for two separate code bases and allow enveloped and non-enveloped messages to be handled in a uniform fashion. By processing canonical messages which include enveloped messages and non-enveloped messages, alternative embodiments remove the need to process non-enveloped messages differently by higher level components or applications. In addition, additional embodiments of the invention provide runtime detection of semantic errors that would lead to data loss when an enveloped message is rewritten into a non-enveloped form.

Briefly described, embodiments of the invention are directed to a system for generating a canonical message. The system includes an application for generating the canonical message for a destination via a communication network. The canonical message includes coded parameters that identify information for handling the canonical message in a desired communication protocol. The system also includes an encoder for converting the canonical message to one of an enveloped message and a non-enveloped message. The encoder converts the canonical message to the enveloped message by generating an envelope having a stack including information associated with a particular network protocol represented by the coded parameters. The encoder converts the canonical message to the non-enveloped message by generating a network protocol packet having the entire contents of the canonical message. The system also includes a message processing component for delivering the enveloped message or the non-enveloped message to the destination via the communication network.

In another embodiment of the invention, a method embodying aspects of the invention generates a canonical message. The canonical message is generated for a destination via a communication network. The canonical message includes coded parameters that identify information for handling the canonical message in a desired communication protocol. The canonical message is converted to one of the following: an enveloped message and a non-enveloped message. Converting the canonical message to the enveloped message involves generating an envelope having a stack including information associated with a particular network protocol represented by the coded parameters. Converting the canonical message to the non-enveloped message involves generating a network protocol packet having the entire contents of the canonical message. The enveloped message or the non-enveloped message is delivered to the destination via the communication network.

In yet another embodiment of the invention, a computer readable medium stores computer-executable components for generating a canonical message. The components include an encoder for generating the canonical message for a destination via a communication network. The canonical message includes coded parameters that identify information for handling the canonical message in a desired communication protocol. The encoder also converts the canonical message to one of an enveloped message and a non-enveloped message. The encoder converts the canonical message to the enveloped message by generating an envelope having a stack including information associated with a particular network protocol represented by the coded parameters. The encoder converts the canonical message to the non-enveloped message by generating a network protocol packet having the entire contents of the canonical message. The components also include a message processing component for delivering the enveloped message or the non-enveloped message to the destination via the communication network Other features will be in part apparent and in part pointed out hereinafter.

BRIEF DESCRIPTION OF THE DRAWINGS

FIG. 2A is an exemplary flow chart illustrating operation of converting a portion of a message to a canonical message in a common format according to an embodiment of the invention.

DETAILED DESCRIPTION

Figure 1A:
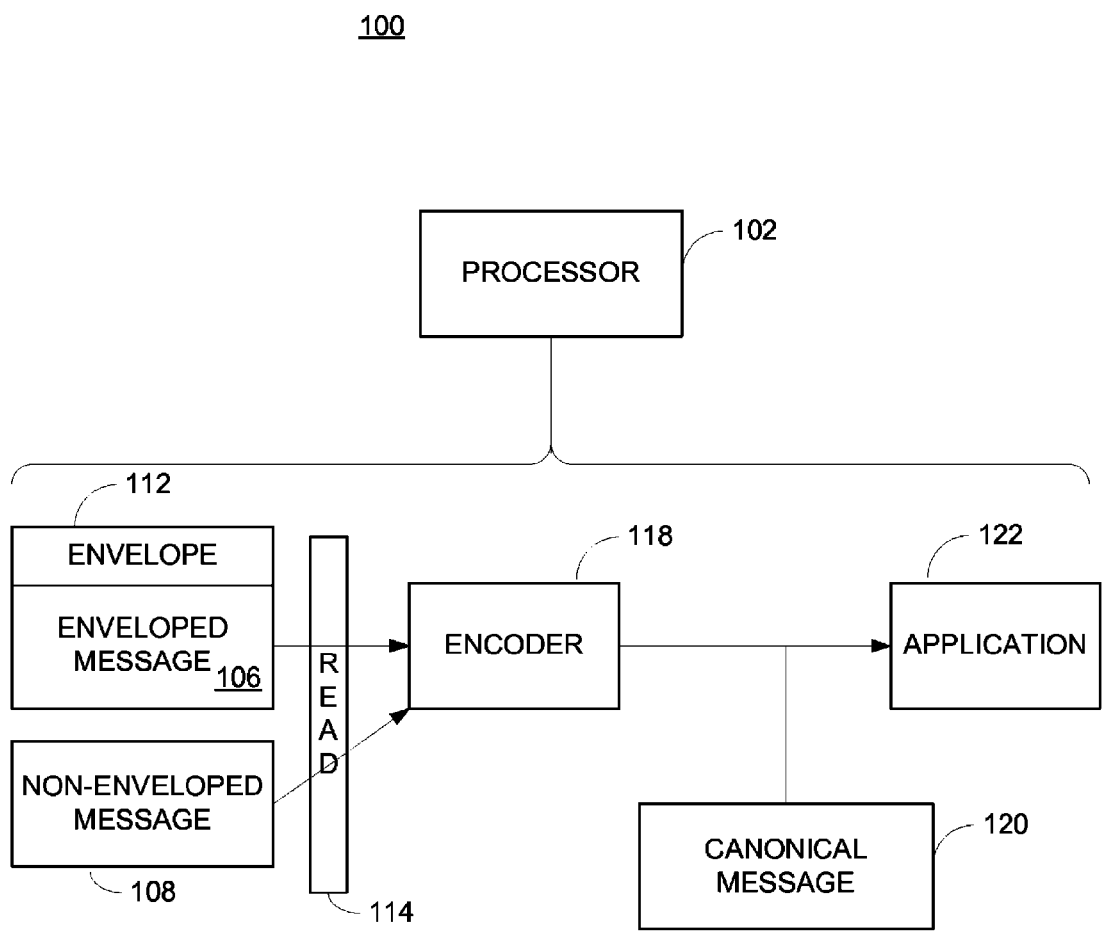
FIG. 1A is an exemplary block diagram illustrates an embodiment of a system for converting a portion of a message to a canonical message received from a source to a destination via a communication protocol according to an embodiment of the invention.

Embodiments of the invention enhance processing of messages by converting either an enveloped or a non-enveloped message to a canonical message having a common format, such as a message having just a header and a body section. The canonical message described herein includes all of the information represented by the enveloped or non-enveloped but does not require the source or the destination to have advance knowledge of the information used while processing the message.

Referring now to FIG. 1, a diagram illustrates a system 100 for converting a portion of a message to a canonical message received from a source to a destination via a communication protocol according to an embodiment of the invention. The system 100 includes a processor 102 having been configured for executing computer-executable instructions, codes, routines, computer executable components, or the like. In another example, the processor 102 executes an application, such as application 122. The application 122 may be software, an application program, an operating system, or a component of an application, software, an application program, or an operating system.

The processor 102 processes either an enveloped message 106 or a non-enveloped message 108. The enveloped message 106 is a computerized message having an envelope 112. In one example, the envelope 112 includes an application stack that includes information regarding how the enveloped message 106 is to be handled. In one existing example, a SOAP message is a type of the enveloped message 106 that includes information for a receiving application or program to handle the enveloped message 106. On the other hand, the non-enveloped message 108 does not include the envelope 112 and does not include information for handling the non-enveloped message 108. Instead, the non-enveloped message 108 includes a header, addressing information (e.g., destination Uniform Resource Identifier (URI)), and a body of the non-enveloped message 108.

Previously, a system similar to the system 100 had separate ways of handling or processing the enveloped message 106 and the non-enveloped message 108. In one example, the enveloped message 106 requires both the sender and the receiver to understand the application stack associated with the envelope 112 in order to properly process the enveloped message 106. As such, developers would prepare codes or routines for processing a particular enveloped message 106. On the other hand, the non-enveloped message 108 uses a different set of network protocols. Therefore, if an enveloped message 106 is transmitted to a system that does not understand the format or content of the envelope 112, the enveloped message 106 would not be processed properly. As such, developers for either the sender or the receiver would be processing the two messages differently and would require separate code bases. This implementation inconveniently requires resources in terms of storage space, time for updating the code base, or the like in order to process the enveloped message 106 and the non-enveloped message 108.

Embodiments of the invention solve the shortcoming of the existing practice by developing a scheme to rewrite messages as they move from an enveloped to a non-enveloped message processing stack and as they move from a non-enveloped to an enveloped message processing stack. This rewriting or transformation process is done such that neither the enveloped nor non-enveloped message processing stacks requires knowledge or further special processing of the mapped messages. The non-enveloped messages 108 may always be mapped to the enveloped messages 106 with full fidelity. In an alternative embodiment, the enveloped messages 106 or the non-enveloped message 108 can detect modifications that would lead to semantic data loss during the reverse mapping process and reject those modifications at the time that they are made.

Still referring to FIG. 1A, the enveloped message 106 or the non-enveloped message 108 is received by the system 102. For example, the enveloped message 106 or the non-enveloped message 108 may be received via a communication protocol through a network interface. In one embodiment, a set of components 114 reads raw message bytes from a network transport (e.g. an HTTP connection between two systems). For example, the set of components 114 detect the envelope 112 in the data stream. The network transport component also assists an encoder 118 by moving properties between the transport headers and message headers.

The system 100 also includes the encoder 118 which converts between messages and raw byte streams. In one embodiment, the encoder 118 transforms the enveloped message 106 or non-enveloped message 108 to a canonical message 120. In one embodiment, the encoder 118 reads the non-enveloped message 108 as if an enveloped message with no headers had been received. The encoder 118 extracts addressing information from the incoming network protocol message and writes the information into the headers of the canonical message. By way of example, for a system using the HTTP network protocol and SOAP envelope format, the encoder 118 writes the HTTP request URI into the headers of the canonical message as a WS-Addressing "To" header. In another embodiment, other protocol information from the incoming network message, such as the HTTP header collection, is preserved along with the canonical message but not written directly into it. The encoder 118 also writes the application payload or the body of the non-enveloped message 108 as the body of the canonical message in its entirety. By such transformation, the canonical message 120 is then surfaced to an application stack without requiring the application stack to change or accommodate the canonical message 120 in any way. Once the encoder 118 has finished transforming the non-enveloped message 108 to the canonical message 120, an application 122 processes the canonical message 120 in place of the non-enveloped message 108.

On the other hand, the encoder 118 transforms an enveloped message 106 to the canonical message 120 by encoding parameters from defined parameters in the envelope 112. Using a SOAP envelope as an example, the SOAP envelope may include the following defined parameters:

```
<SOAP-ENV:Envelope
xmlns.SOAP-ENV="http://schemas.xmlsoap.org/soap/envelope/"
xmlns:xsi="http://www.w3.org/1999/XMLSchema-instance"
xmlns:xsd="http://www.w3.org/1999/XMLSchema">
    <SOAP-ENV:Body>
        <ns1:doubleAnIntegerResponse
        xmlns:ns1="urn:MySoapServices"
        SOAP-ENV:encodingStyle="http://schemas.xmlsoap.org/soap/
        encoding/">
        <return xsi:type="xsd:int">246</return>
        </ns1:doubleAnIntergerResponse>
    </SOAP-ENV:Body>
</SOAP-ENV:Envelope>
```

Originally, the enveloped message 106 requires the receiving application or processing component to first retrieve the schema from "http://schemas.xmlsoap.org/soap/encoding/". In the <SOAP-ENV:Body> section, the above message further defines a method <ns1:doubleAnIntegerResponse> with a return value denoted by the return tags <return>. In other words, a typical enveloped message 106 may include specific information and parameters that the receiving application or processing components must understand in advance before processing the envelope 112.

The encoder 118, however, transforms the defined parameters above to the coded parameters used in the canonical message 120. The coded parameters include all of the information as expressed in the envelope 112 but without the envelope. In other words, the encoder 118, by way of example, writes the HTTP request URI and the SOAP envelope information into the headers of the canonical message as a WS-Addressing "To" header. As such, the receiving application (e.g., application 122) does not need to distinguish the incoming message as being enveloped or non-enveloped in cases where the requirements can be met by either form. In an alternative embodiment, the encoder 118 may be configured with a switch set by application developers to control whether the encoder should expect enveloped or non-enveloped message when the encoder 118 is reading the incoming messages.

Figure 1B:
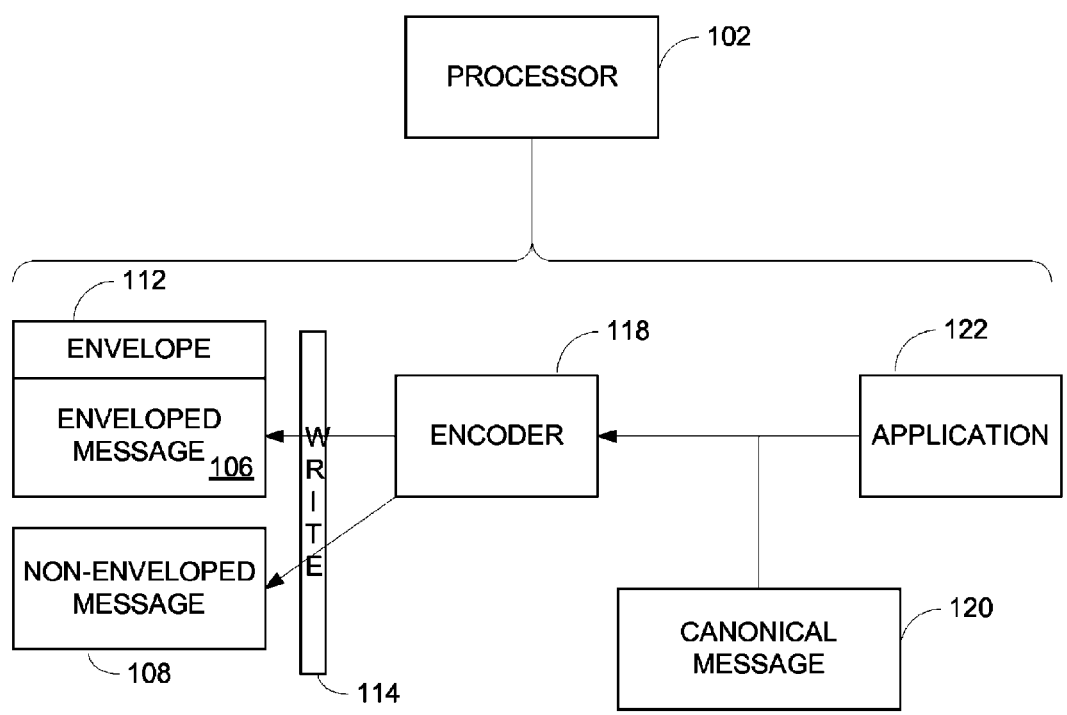
FIG. 1B is an exemplary block diagram illustrating an embodiment of a system for generating an enveloped or a non-enveloped message from a canonical message according to an embodiment of the invention.

Similarly, on the transmitting end, FIG. 1B illustrates the system 100 with the application 122 converting the canonical message 120 to either the enveloped message 108 or the non-enveloped message 106. For example, the encoder 118 reads or detects a canonical message 120 generated by the application 122 and identifies the header information in the canonical message as described above. In one embodiment, the encoder 108 is configured with a switch that can be set by application developers to control whether the encoder 118 should emit an enveloped message or a non-enveloped message. The encoder 118 converts the read or detected information from the header and generates the appropriate enveloped message 106 or non-enveloped message 108.

By so doing, the difference between an enveloped message 106 and a non-enveloped message 108 is hidden from the consuming or processing application (e.g., application 122), and the application 122 does not need to maintain separate code bases for processing enveloped messages 106 or non-enveloped messages 108.

FIG. 2A is an exemplary flow chart illustrating the operation of converting a portion of a message to a canonical message in a common format according to an embodiment of the invention. At 202, a message (e.g., enveloped message 106 or non-enveloped message 108) is received. At 204, a set of components detects whether the received message includes an encoded envelope in the portion of the message. The encoded envelope includes a stack defining parameters including information for handling the received message in its original format. At 206, if the received message includes the encoded envelope, the defined parameters included in the encoded envelope are transformed to coded parameters in a common format at 208. The coded parameters express the same information for handling the received message as defined by the communication protocol. The encoded envelope is encapsulated by the received message after the transforming at 210 and the received message having the coded parameters and the encoded envelope encapsulated in the common format is delivered to the destination via the communication protocol at 214.

On the other hand, if it is determined at 206 that the received message does not include the encoded envelope, coded parameters are generated in the common format for the received message by encoding addressing information from the received message at 212. The received message having the coded parameters in the common format is next delivered to the destination via the communication protocol at 214.

Figure 2B:
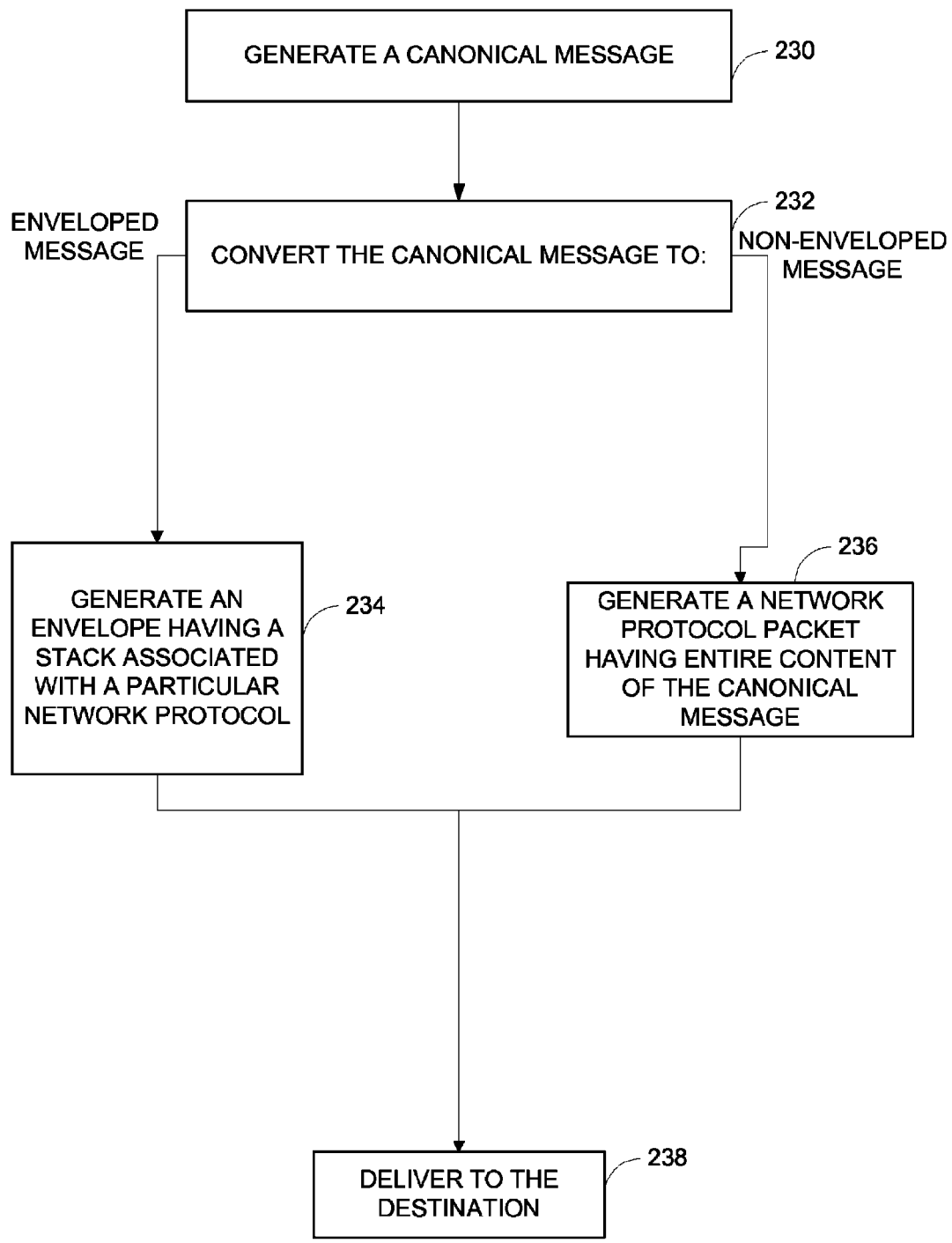
FIG. 2B is an exemplary flow chart illustrating operation of generating an enveloped or a non-enveloped message from a canonical message according to an embodiment of the invention.

FIG. 2B is an exemplary flow chart illustrating the operation of generating an enveloped or a non-enveloped message from a canonical message according to an embodiment of the invention. At 230, an application (e.g., application 122) generates a canonical message for a destination via a communication network. The canonical message includes coded parameters that identify information for handling the canonical message using a desired communication protocol. At 232, it is determined whether to convert the canonical message to an enveloped message or a non-enveloped message. In converting the canonical message to the enveloped message, an encoder converts the canonical message to the enveloped message by generating an envelope that is compliant with a particular network protocol represented by the coded parameters at 234.

If it is determined that the encoder converts the canonical message to the non-enveloped message, the encoder converts the canonical message to the non-enveloped message by generating a network protocol packet having the entire contents of the canonical message at 236. At 238, a message processing component delivers the enveloped message or the non-enveloped message to the destination via the communication network.

For example, when writing a canonical message to a non-enveloped transport, the encoder constructs a network protocol packet. Continuing the example of transmitting SOAP messages using HTTP, this would constitute the HTTP request or response message. The canonical message passed down from the application stack is created in an enveloped form. To construct the non-enveloped message, the encoder takes the body of the canonical message and writes it directly into the protocol packet as its payload. All information pertaining to the envelope structure of the canonical message is included by this transformation. This transformation allows the application stack to carry additional information intended to influence the protocol packet constructed by the encoder, again such as the HTTP header collection. This information is created by the application stack and passed to the encoder along with the canonical message but is not written directly into it. Any information passed to the encoder in such a manner is preserved in the network protocol packet emitted from the encoder.

In an alternative embodiment, during the conversion or transformation, the canonical message model with which applications interact is enveloped or stored. As such, the message abstraction used by application code maintains a collection of headers for eventual transmission to the network. The header collection contains both the headers supported by the underlying network transport and virtually mapped headers that exist to support the illusion of a native enveloped message format. As such, embodiments of the invention also detect errors in the canonical message by comparing the envelope with the resulting canonical message. We distinguish modifications to these two types of headers, and define any attempt to add or modify a header to a message that the non-enveloped encoder cannot physically represent to be an error condition. This error condition manifest as an application-level exception that terminates processing of the current message upon the first attempt to add any header that we know will not be transmitted due to a transformation by the encoder.

In one embodiment, the error detection is achieved by assigning each encoder an envelope version that corresponds to the enveloping protocol it is written to support. For example, three envelope versions: SOAP11, SOAP12, and None are defined for this purpose. These versions correspond to the SOAP 1.1 envelope format, the SOAP 1.2 envelope format, and non-enveloped messages, respectively. All message instances that pass through an encoder are stamped with the encoder's envelope version. The encoders that are configured to process non-enveloped messages create message instances with an envelope version of "None". In one embodiment, any attempt to add or modify an unsupported header to a message with an envelope version of "None" will trigger an exception. As such, there is an error in the conversion process and the user is notified of the error. In an alternative embodiment, the error detection is performed in runtime as the conversion or transformation takes place. In another embodiment, the error detection may be achieved intrinsically when the canonical message is generated or transformed, thus bypassing the need to convert the canonical message back to the enveloped or non-enveloped message at a later time. For example, the error detection may occur in response to one or more of the following: before the transforming and after the encapsulating if the received message includes the encoded envelope or after the generating if the received message does not include the encoded envelope. In another embodiment, the error detection may be achieved by converting the canonical message to the enveloped message or the non-enveloped message.

Figure 3:
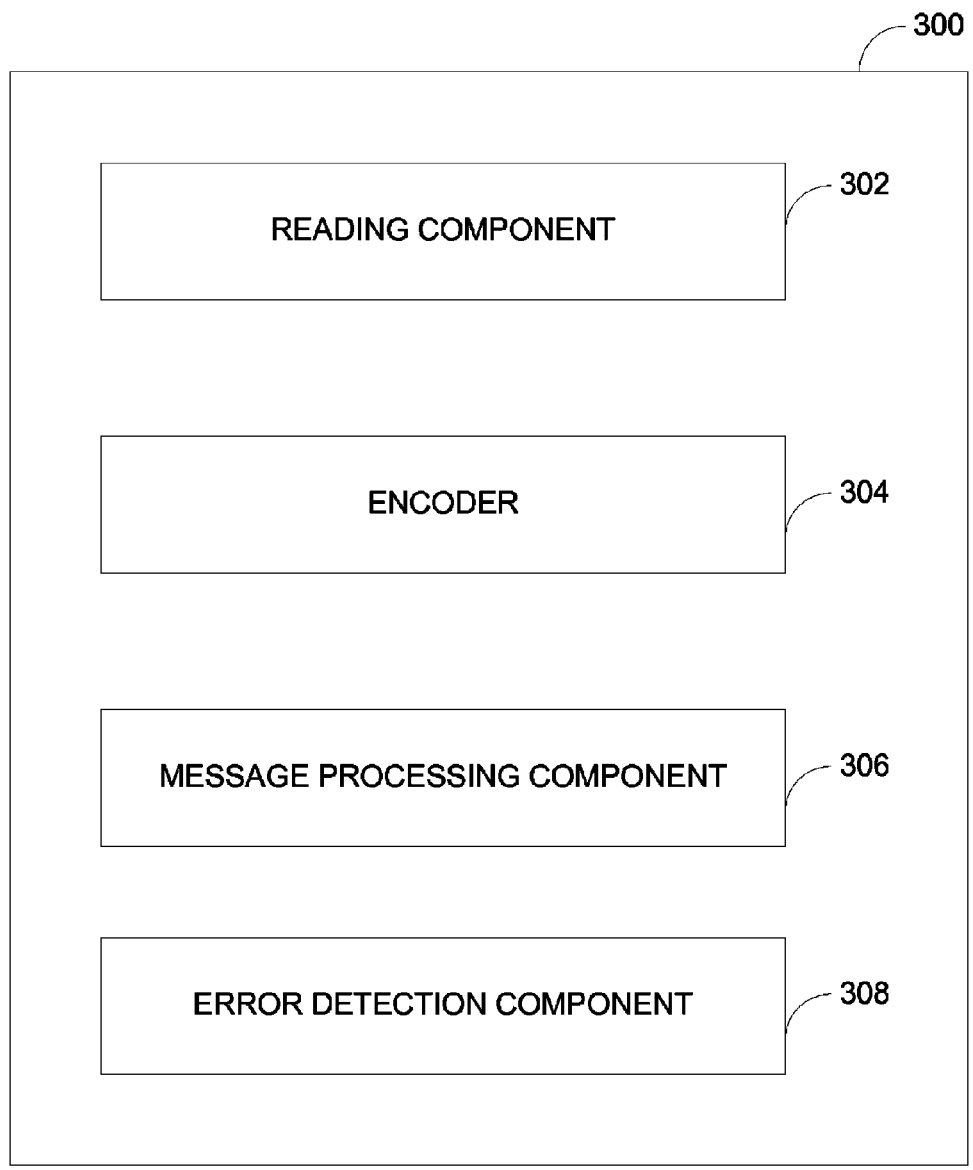
FIG. 3 is a block diagram illustrating an exemplary computer-readable medium on which aspects of the invention may be stored.

FIG. 3 is a block diagram illustrating an exemplary computer-readable medium 300 on which aspects of the invention may be stored. In one embodiment, the computer-readable medium 300 includes one or more computer-executable components performing at least the operations discussed in FIGS. 2A and 2B. For example, a reading component 302 detects or reads whether the message includes an encoded envelope by reading bytes from the message. The encoded envelope includes a stack defining parameters including information for handling the received message in an original format. If the received message includes an encoded envelope, an encoder 304 converts the defined parameters included in the encoded envelope to coded parameters in a common format. The coded parameters express the same information for handling the received message in the communication protocol. The encoder 304 encapsulates the encoded envelope from the received message after the conversion. A message processing component 306 delivers the message having the coded parameters and the encoded envelope encapsulated in the common format to the destination via the communication protocol. On the other hand, if the received message does not include an encoded envelope, the encoder 304 generates coded parameters in the common format for the received message by encoding addressing information from the body of the message. The message processing component 306 delivers the message having the coded parameters in the common format to the destination via the communication protocol.

In a further embodiment, the computer-readable medium 300 includes an error detection component 308. For example, the error detection component 308 may be intrinsically incorporated into the storage/generation/transformation of the canonical message. This composition permits the error detection component to operate without having the encoder convert the canonical message to the enveloped message or the non-enveloped message. In another embodiment, the error detection component 308 may detect errors by having the encoder converting the canonical message to the enveloped message or the non-enveloped message.

In another embodiment, the computer-readable medium 300, which includes both volatile and nonvolatile media, removable and non-removable media, may be any available medium that may be accessed by a computing device. By way of example and not limitation, computer readable medium comprises computer storage medium and communication medium. Computer storage medium includes volatile and nonvolatile, removable and non-removable media implemented in any method or technology for storage of information such as computer readable instructions, data structures, program modules or other data. For example, computer storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information and that may be accessed by a computing device. Communication medium typically embodies computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Wired media, such as a wired network or direct-wired connection, and wireless media, such as acoustic, RF, infrared, and other wireless media, are examples of communication medium. Combinations of any of the above are also included within the scope of computer readable media.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Embodiments of the invention may be implemented with computer-executable instructions. The computer-executable instructions may be organized into one or more computer-executable components or modules. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. A system for generating a canonical message, said system comprising:

an application for generating the canonical message for a destination via a communication network, said canonical message including coded parameters that identify information for handling the canonical message in a desired communication protocol;

an encoder for converting the canonical message to one of the following: an enveloped message and a non-enveloped message, said encoder converting the canonical message to the enveloped message by generating an envelope having a stack including information associated with a particular network protocol represented by the coded parameters, said encoder converting the canonical message to the non-enveloped message by generating a network protocol packet having the entire contents of the canonical message; and a message processing component for delivering the enveloped message or the non-enveloped message to the destination via the communication network.

2. The system of claim 1, further comprising an error detection component for:

detecting errors in the coded parameters in the common format after the encoder converts the canonical message to the enveloped message by comparing the coded parameters of the canonical message with the generated envelope or the generated network protocol packet; or detecting errors in the coded parameters in the common format in the non-enveloped message by comparing the coded parameters of the canonical message with the generated envelope or the generated network protocol packet; or detecting errors in the coded parameters before the application generates the canonical message.

3. The system of claim 1, further comprising a reading component at the destination, said reading component detecting whether the message includes the envelope by reading message bytes of the message, said encoded envelope having the stack including information for handling the received message in an original format.

4. The system of claim 3, further comprising, if the received message includes the envelope, an encoder at the destination for converting information represented by the particular network protocol included in the stack to the coded parameters in a common format.

5. The system of claim 4, wherein the encoder at the destination encapsulates the encoded envelope from the received message after the conversion.

6. The system of claim 4, wherein, if the received message does not include the envelope, the encoder at the destination generates coded parameters in the common format for the message by generating the network protocol packet in the body of the canonical message.

7. The system of claim 6, wherein the message processing component delivers the message having the coded parameters in the common format to the destination via the communication protocol.

8. A method for generating a canonical message, said method comprising:

generating the canonical message for a destination via a communication network, said canonical message including coded parameters that identify information for handling the canonical message in a desired communication protocol;

converting the canonical message to one of the following: an enveloped message and a non-enveloped message, said converting the canonical message to the enveloped message further comprising generating an envelope having a stack including information associated with a particular network protocol represented by the coded parameters, said converting the canonical message to the non-enveloped message further comprising generating a network protocol packet having the entire contents of the canonical message; and delivering the enveloped message or the non-enveloped message to the destination via the communication network.

9. The method of claim 8, further comprising:

detecting errors in the coded parameters in the common format after the encoder converts the canonical message to the enveloped message by comparing the coded parameters of the canonical message with the generated envelope or the generated network protocol packet; or detecting errors in the coded parameters in the common format in the non-enveloped message by comparing the coded parameters of the canonical message with the generated envelope or the generated network protocol packet; or detecting errors in the coded parameters before the application generates the canonical message.

10. The method of claim 8, further comprising detecting, at the destination, whether the message includes the envelope by reading message bytes of the message, said encoded envelope having the stack including information for handling the received message in an original format.

11. The method of claim 10, further comprising converting at the destination, if the received message includes the envelope, information represented by the particular network protocol included in the stack to the coded parameters in a common format.

12. The method of claim 11, further comprising encapsulating, at the destination, the encoded envelope from the received message after the conversion.

13. The system of claim 11, further comprising generating at the destination, if the received message does not include the envelope, coded parameters in the common format for the message by generating the network protocol packet in the body of the canonical message.

14. The system of claim 13, further comprising delivering the message having the coded parameters in the common format to the destination via the communication protocol.

15. A computer-readable medium having computer-executable components for generating a canonical message, said computer-executable components comprising:

an encoder for:

generating the canonical message for a destination via a communication network, said canonical message including coded parameters that identify information for handling the canonical message in a desired communication protocol; and converting the canonical message to one of the following: an enveloped message and a non-enveloped message, said encoder converting the canonical message to the enveloped message by generating an envelope having a stack including information associated with a particular network protocol represented by the coded parameters, said encoder converting the canonical message to the non-enveloped message by generating a network protocol packet having the entire contents of the canonical message; and a message processing component for delivering the enveloped message or the non-enveloped message to the destination via the communication network.

16. The computer-readable medium of claim 15, further comprising an error detection component for:

detecting errors in the coded parameters in the common format after the encoder converts the canonical message to the enveloped message by comparing the coded parameters of the canonical message with the generated envelope or the generated network protocol packet; or detecting errors in the coded parameters in the common format in the non-enveloped message by comparing the coded parameters of the canonical message with the generated envelope or the generated network protocol packet; or detecting errors in the coded parameters before the application generates the canonical message.

17. The computer-readable medium of claim 15, further comprising a reading component at the destination, said reading component detecting whether the message includes the envelope by reading message bytes of the message, said encoded envelope having the stack including information for handling the received message in an original format.

18. The computer-readable medium of claim 17, further comprising, if the received message includes the envelope, an encoder at the destination for converting information represented by the particular network protocol included in the stack to the coded parameters in a common format.

19. The computer-readable medium of claim 18, wherein the encoder at the destination encapsulates the encoded envelope from the received message after the conversion.

20. The computer-readable medium of claim 18, wherein, if the received message does not include the envelope, the encoder at the destination generates coded parameters in the common format for the message by generating the network protocol packet in the body of the canonical message, and wherein the message processing component delivers the message having the coded parameters in the common format to the destination via the communication protocol.

* * * * *